(12) United States Patent
Maus et al.

(10) Patent No.: US 12,191,137 B2
(45) Date of Patent: Jan. 7, 2025

(54) METHOD FOR MANUFACTURING A COMPONENT ARRANGEMENT FOR A PACKAGE, METHOD FOR MANUFACTURING A PACKAGE HAVING A COMPONENT ARRANGEMENT, A COMPONENT ARRANGEMENT AND A PACKAGE

(71) Applicant: MSG Lithoglas GmbH, Dresden (DE)

(72) Inventors: Simon Maus, Berlin (DE); Ulli Hansen, Berlin (DE)

(73) Assignee: MSG LITHOGLAS GMBH, Dresden (DE)

( * ) Notice: Subject to any disclaimer, the term of this patent is extended or adjusted under 35 U.S.C. 154(b) by 185 days.

(21) Appl. No.: 17/618,920

(22) PCT Filed: Jun. 22, 2020

(86) PCT No.: PCT/DE2020/100529
§ 371 (c)(1),
(2) Date: Dec. 14, 2021

(87) PCT Pub. No.: WO2020/259755
PCT Pub. Date: Dec. 30, 2020

(65) Prior Publication Data
US 2022/0415645 A1 Dec. 29, 2022

(30) Foreign Application Priority Data

Jun. 24, 2019 (DE) .......................... 102019116920.8
Jul. 11, 2019 (DE) .......................... 102019118797.4

(51) Int. Cl.
*H01L 21/02* (2006.01)
*H01L 21/78* (2006.01)

(52) U.S. Cl.
CPC ........ *H01L 21/02019* (2013.01); *H01L 21/78* (2013.01)

(58) Field of Classification Search
None
See application file for complete search history.

(56) References Cited

U.S. PATENT DOCUMENTS 7,177,331 B2    2/2007  Yen et al.
2006/0283836 A1 12/2006 Shiv
(Continued)

FOREIGN PATENT DOCUMENTS

CN    106170898 A    11/2016
JP    2000-91688 A   3/2000
(Continued)

OTHER PUBLICATIONS

International Search Report for PCT/DE2020/100529 issued Nov. 6, 2020.

*Primary Examiner* — Shamim Ahmed
(74) *Attorney, Agent, or Firm* — Schmeiser, Olsen & Watts LLP (57) ABSTRACT

Provided is a method for manufacturing a component arrangement for a package, including providing a wafer made of a semiconductor material having a polished wafer surface; forming an opening in the wafer by anisotropic etching, wherein an anisotropically etched surface is manufactured near the opening; separating a component from the anisotropically etched wafer, wherein the separated component is manufactured having the following surfaces: an optical surface formed near a surface portion of the polished wafer surface and a mounting surface formed in the region of the anisotropically etched surface; and mounting the separated component on a substrate surface of a carrier substrate using the mounting surface in such a manner that the anisotropically etched surface is bonded to the substrate (Continued)

surface, wherein the optical surface is arranged as an inclined exposed surface. Furthermore, a component arrangement and a package are provided having a component arrangement.

10 Claims, 5 Drawing Sheets

(56) References Cited

U.S. PATENT DOCUMENTS

| | | |
|---|---|---|
| 2007/0086095 A1 | 4/2007 | Wang |
| 2008/0157361 A1* | 7/2008 | Wood .................... H01L 23/481 |
| | | 257/E21.597 |
| 2010/0226655 A1 | 9/2010 | Kim |
| 2011/0049554 A1 | 3/2011 | Wu et al. |
| 2017/0033528 A1 | 2/2017 | Tanisaka |
| 2017/0063034 A1 | 3/2017 | Tanisaka |
| 2019/0097381 A1 | 3/2019 | Miyata |

FOREIGN PATENT DOCUMENTS

| | | |
|---|---|---|
| JP | 2001-42175 A | 2/2001 |
| JP | 2010-522349 A | 7/2010 |
| JP | 2011-49562 A | 3/2011 |
| JP | 2017-45795 A | 3/2017 |
| TW | 201421708 A | 6/2014 |
| WO | 2011/035783 A1 | 3/2011 |
| WO | 2016/055520 A1 | 4/2016 |
| WO | 2017/149573 A1 | 9/2017 |

* cited by examiner

Fig. 10

METHOD FOR MANUFACTURING A COMPONENT ARRANGEMENT FOR A PACKAGE, METHOD FOR MANUFACTURING A PACKAGE HAVING A COMPONENT ARRANGEMENT, A COMPONENT ARRANGEMENT AND A PACKAGE

CROSS-REFERENCE TO RELATED APPLICATIONS

This application claims priority to PCT Application No. PCT/DE2020/100529, having a filing date of Jun. 22, 2020, which is based on German Application Nos. 102019118797.4, having a filing date of Jul. 11, 2019, and 102019116920.8, having a filing date of Jun. 24, 2019, the entire contents all of which are hereby incorporated by reference.

FIELD OF TECHNOLOGY

The following relates to a method for manufacturing a component arrangement for a package, a method for manufacturing a package having a component arrangement, a component arrangement and a package.

BACKGROUND

In relation to the component arrangements, it is known to arrange components or elements, for example optical elements which emit or receive light, in a housing. The component arrangement can be used to manufacture a package, i.e., generally a casing or the forming of a housing which accommodates the component arrangement including the connection points.

A method for manufacturing such a component arrangement is for example known from document WO 2011/035783 A1. A spacer is arranged on a carrier substrate in such a manner that the spacer surrounds an installation space in which an element is arranged. The installation space is closed by arranging a cover substrate on the spacer. The cover substrate may provide a translucent outlet opening through which light can be emitted or received. Wall surfaces of the spacer directed toward the installation space can be provided with a metal coating to provide a light-reflecting mirror coating.

WO 2016/055520 A1 describes the manufacturing of a package for a laser element having a housing comprising a carrier, which has a cavity having a bottom surface and a side wall. The cavity expands starting from the bottom surface. In the cavity, a laser chip is arranged on the bottom surface, the emission direction of which is oriented parallel to the bottom surface. A reflective element is also arranged in the cavity, abutting on an edge between the bottom surface and the side wall. A reflective surface of the reflective element includes an angle of 45 degrees to the bottom surface of the cavity. The emission direction also includes an angle of 45 degrees to the reflective surface of the reflective element.

A component arrangement is further known from WO 2017/149573 A1.

In U.S. Pat. No. 7,177,331 B2, a laser diode is built in a so-called TO package.

SUMMARY

An aspect relates to a method for manufacturing a component arrangement for a package and for manufacturing a package as well as a component arrangement and a package, in which method an optical functional surface may be manufactured in a more efficient manner and with improved quality in relation to the optical properties.

According to an aspect, a method for manufacturing a component arrangement for a package is provided, wherein the method comprises the following: providing a wafer made of a semiconductor material with a polished wafer surface, wherein an anisotropically etched surface is manufactured in the region of the opening; forming an opening in the wafer by anisotropic etching; separating a component from the anisotropically etched wafer, wherein the separated component is manufactured having an optical surface formed in the region of a surface portion of the polished wafer surface and a mounting surface formed in the region of the anisotropically etched surface; and mounting the separated component on a substrate surface of a carrier substrate using the mounting surface in such a manner that the anisotropically etched surface is bonded to the substrate surface, wherein the optical surface is arranged as an inclined exposed surface.

Furthermore, a method for manufacturing a package having such a component arrangement is provided, wherein a housing is manufactured by a housing component, in which at least the separated component is accommodated.

According to a further aspect, a component arrangement is provided with a carrier substrate and a component arranged thereon, which has been separated from a wafer made of a semiconductor material. The component has a mounting surface on an anisotropically etched surface and is mounted on a substrate surface of the carrier substrate using the mounting surface. The component has an optical surface which in a surface portion of a polished wafer surface of the wafer The optical surface is arranged as an inclined exposed surface.

Furthermore, a package having such a component arrangement is provided, wherein a housing is formed by a housing component, in which at least the component is accommodated.

The optical surface may be formed so as to be at least partially light-reflecting, light-dispersing and/or light-absorbing with respect to incident light beams. The optical surface may also be formed to polarize (light-polarize) incident light.

Anisotropic etching can be executed by wet chemical etching, for example by etching with caustic potash (KOH). Further useful etching solutions for anisotropic etching are for example tetramethylammonium hydroxide (TMAH) or a mixture of ethylenediamine and water with admixtures of pyrocatechol and pyrazine (EDP, ethylenediamine-pyrocatechol), particularly in combination with silicon. However, dry etching can also be used.

To improve the surface finish of the anisotropically etched planes, one or a plurality of additives, for example salts, may be added to the etching solution. Alcohol-based additives, such as isopropanol, can also be used here. The supplements can also increase the selectivity of the etch rates of the crystal planes to be etched.

The polished surface itself can be used for forming the optical surface, i.e., without depositing or arranging layer material thereon.

The optical surface may be manufactured having an optical functional surface, wherein hereby an optical functional layer is applied in the surface portion of the polished wafer surface in such a manner that the optical properties of the polished wafer surface are changed in the surface portion. The optical functional layer, by which the optical functional surface is formed in the region of the polished wafer surface, specifically changes the optical properties of the surface portion in relation to the optical properties thereof without the optical functional layer, that is, in the state of the polished wafer surface. By the optical functional layer, different optical properties may be provided in the surface portion, particularly the behavior in relation to light-reflection, light-absorption and/or light-dispersion. The optical functional surface may be formed so as to be at least partially light-reflecting, light-dispersing and/or light-absorbing in relation to incident light beams. The manufacturing of the optical functional surface in the region of the polished wafer surface has the advantage that hereby the optical functional layer is applied on a substrate, i.e., the polished wafer surface, which can be manufactured in a reproducible manner on wafer level having desired surface properties, particularly regarding the smoothness thereof.

The optical functional surface having the optical functional layer may be applied at wafer level prior to separation. A plurality of separate optical functional surfaces may be manufactured at wafer level in the region of the polished wafer surface, which then serve as optical functional surfaces for separated components during separation. As an alternative to applying the optical functional surface(s) at wafer level, the optical functional surface can be manufactured after the separation.

The optical functional surface can be manufactured having a microstructured layer. Using the microstructured layer, it is possible to provide the optical functional surface or layer with desired optical properties. For example, it may be intended that the microstructured layer reflects incident light beams in a focusing/expanding and/or dispersing manner. In the region of the microstructured layer, Fresnel lenses can be provided at least in some regions.

For forming the optical functional layer, a layer material such as glass or plastics can be applied to the polished wafer surface. Microstructuring of the optical functional layer may comprise processing by one or a plurality of methods from the following group: forming, embossing, molding, etching, 3D printing and plasma processing, for example for manufacturing one or a plurality of lenses (for example trough(s)) in the coating material. Alternatively, the polished wafer surface can be processed at wafer level, i.e., without applying the optical functional layer, for example for manufacturing at least one lens. The manufactured microstructure can then be provided with a mirror coating in the different embodiments.

The optical functional layer can be applied as a multilayer system. Multilayer systems further support the formation of the desired optical properties, which are provided in the region of the surface portion of the polished wafer surface by the optical functional layer. For example, a dielectric mirror can be applied in this manner. With such or other mirror layers, it may be intended to employ a metallic layer as a mirror, for example made of aluminum, silver, copper or gold.

The optical functional layer may be executed with a beam-splitting function, for example for applications in the IR spectral range (IR—infrared).

The anisotropically etched surface can be manufactured having an inclination angle of approximately 45 degrees in relation to the polished wafer surface. The optical functional surface can have an inclination angle of approximately 45 degrees in relation to the surface of the carrier substrate (and the polished wafer surface). With suitably manufactured crystals—for example tilting for 100 orientation of a silicon crystal—almost any inclination angle can be precisely adjusted.

A wafer made of silicon may be provided and etched in an anisotropic manner.

The mounting surface may be formed having a mounting functional layer manufactured in the region of the mounting surface.

The mounting functional layer can be manufactured having a solderable metal coating. When mounting the separated component on the substrate surface of the carrier substrate, the component is then soldered using the solderable metal coating. The mounting functional layer can be manufactured having an adhesive layer.

The mounting functional layer can be applied at wafer level prior to separation. In the region of the anisotropically etched surfaces, a plurality of separate mounting functional layers can be manufactured in different regions in such a manner that, after separation, they serve as the respective mounting functional layer for different components, which makes it possible to mount the particular separated component. If mounting functional layers are manufactured in different portions of the anisotropically etched surfaces, this makes it possible to provide components with a particular optical functional surface after the separation, in which the optical functional surface has different inclination angles in relation to the polished wafer surface. This utilizes different inclination angles that occur during etching. As an alternative to applying the mounting functional layer(s) at wafer level, the mounting functional layer can be manufactured after the separation.

The configurations explained previously in conjunction with the method for manufacturing a component arrangement for a package may be provided correspondingly in conjunction with the method for manufacturing a package, the component arrangement and the package.

In the component arrangement or in the package, the optical functional surface may serve to redirect or reflect light beams emitted by an optical element, for example a light-emitting diode, from the component arrangement or from the package in such a manner that the light beams are emitted. In contrast, the optical functional surface on the separated component on the carrier substrate can be utilized to couple light beams incident on the component arrangement or on the package from outside to a light-receiving or light-sensitive element, for example a light-sensitive diode or transistor. In the case of the package in which the separating element having the optical functional surface is accommodated in a housing, a housing component has an optical window through which light beams can be emitted and/or received.

Using the proposed technology, it is possible to redirect light beams that pass in a horizontal direction in the installation space provided in the package to the optical functional surface, which is inclined at approximately 45 degrees, in the vertical direction and vice versa. Light emitted by the optical element can be redirected from the horizontal direction to the vertical direction to emit the light beams through an optical window. In contrast, light incident in the vertical direction through the optical window can be redirected in the horizontal direction at the optical functional surface.

The optical component in the package can be formed as a light-emitting or light-absorbing component, for example a light-emitting diode or light-absorbing photodiode, for example an avalanche photodiode, Si photomultiplier or laser diode. The light-emitting component can be designed to emit light beams in a directed and bundled form, for example in the form of substantially directed laser radiation with central emission of the intensity maximum with optionally present beam divergence (beam widening).

The proposed technology allows the optical element to be arranged in the installation space of the package in such a manner that the output of the light beams emitted or the input of the light beams to be received can occur in a vertical direction. In order to emit light beams in a vertical direction (referring to the surface of the carrier substrate), it is not necessary, contrary to the conventional art, to arrange the optical element in an upright manner in the installation space as intended in the conventional art (compare for example U.S. Pat. No. 7,177,331 B2). Using the proposed technology, the height of the component arrangement and the package may be reduced and the mounting may be simplified.

Contact connections can have a through-connection through the carrier substrate, wherein external contacts can be arranged on the underside of the carrier substrate. A contact connection leading laterally out of the installation space can be provided, for example on the surface of the carrier substrate directed toward the installation space, particularly in such a manner that the laterally led contact connection between the carrier substrate and the spacer is formed therethrough. The contact connection may comprise a plurality of individual contact connections.

The optical element may be arranged on a submount which is arranged on the carrier substrate. The submount can for example be formed from silicon carbide, aluminum nitride, aluminum oxide or silicon.

To manufacture the package, the packaging may be used in a panel or at wafer level.

When manufacturing using wafer level processes, a single or a plurality of elements having a 45 degree inclined optical functional surface can be manufactured at wafer level. The advantage is that many elements can be manufactured simultaneously at wafer level. The individual elements, for example mirror elements, are then created after separation, for example by sawing the substrate. The enclosure of the element can be accomplished by placing a separate cap on a board on which a chip or element is premounted, for example an optical element having a mirror element. The elements may also be premounted in a panel, i.e., a plurality of elements are already mounted on a carrier substrate, which are then housed by applying individual caps or cap arrays (a separated panel having a plurality of cap structures from a cap substrate manufactured at wafer level).

Wafer level packaging as used in this context refers to packing ("packaging") all components on a wafer in one step with a cover substrate in wafer form. For example, this can be the case if elements are completely premounted on a through-connected substrate, for example a silicon substrate in wafer form, and then all components are housed simultaneously by bonding a cap wafer, for example an optical element having a mirror element. Individual packages are then created by subsequently separating the compound.

In conjunction with the package, it may be provided that, regarding the housing in which the component arrangement is accommodated, in relation to an upper side of the housing, light exits or enters in the center substantially in the region of the outlet opening/inlet opening. Hereby, a substantially central light emission/light absorption is realized for the package.

The cover substrate, particularly in the region or for forming an outlet and/or inlet opening, can for example consist of borosilicate glass, for example Bofofloat33 or Mempax from Schott AG, quartz glass, sapphire glass or other glasses such as AF32, D263T, BK7 or B270 from Schott AG; Eagle XG or Pyrex from Corning; SD2 from Hoya or EN-A1 from Asahi. The cover substrate can also be made of silicon or germanium, for example for applications in the IR range. The cover substrate can also have a substrate coating, for example an anti-reflection coating. The coatings can be designed for different wavelength ranges and be executed on one or both sides. Filter coatings and/or opaque aperture structures can also be provided for different wavelength ranges.

Furthermore, the integration of optical elements, for example, lenses on the cover substrate, can be provided in an embodiment. For example, convex lenses made of polymer, glass-like materials, silicon or germanium can be used. The utilization of microstructured Fresnel lenses is also possible.

One or a plurality of through-connections are provided in the carrier substrate for the electrical contact of the optical element. The backside contacts allow later mounting in SMD design, for example by tin/silver flow soldering or mounting with electrically conductive adhesives.

The carrier substrate can, for example, consist of silicon, ceramics such as aluminum nitride, silicon carbide, aluminum oxide, LTTC ceramics (Low Temperature Cofired Ceramics) or HTCC ceramics (High Temperature Cofired Ceramics), glass or DBC (Direct Bonded Copper) substrates. Furthermore, the utilization of metal substrates, for example IMS (Insulated Metal Substrates) made of copper, aluminum or other metals can be provided. The use of plastic carrier substrates such as FR4 is also conceivable. The carrier substrate can be a 3D structured ceramic. In this case, a spacer may therefore not be formed in the cap but in the carrier substrate. In order to close the housing, after mounting the elements in the ceramic cavity, the cavity can be closed by a platelet, for example by a glass platelet. In this case, it is common that a ceramic upper side and the platelet have a corresponding solderable metal coating. For certain applications, however, the use of an adhesive can also be provided here.

An optical window/glass platelet may be connected to the ceramic/the housing by glass solder or a laser welding process. The optical window can be designed with or as a (R) lens. This allows electromagnetic radiation to be output from the package in a collimated or dispersed manner.

A connection between the cap or housing (or when inserting an optical window into the 3D ceramic) and the carrier substrate in the package can be accomplished, for example, by a solder bond, by a eutectic bond. For this purpose, a metal combination with a eutectic composition is applied to the carrier substrate or the back side of the spacer of a housing cap, for example gold and tin, copper and tin, gold and germanium, tin and silver, gold and indium, copper and silver or gold and silicon, forming a eutectic connection phase in a soldering process and connecting the spacer to the carrier substrate. The spacer and carrier substrate are provided with a corresponding base metal coating for the soldering process. For example, the metal combination for the eutectic joining can be provided as a preform. Alternatively, the metal combination can be applied as paste or galvanically to one of the joining partners.

A so-called alloy stop may be arranged below the actual connection phase, for example for thin metal sheets. For example, layers of platinum or nickel or alloys of chrome and nickel are suitable for eutectic joining of gold and tin. The metal combinations of the joining layer described herein are also suitable as an execution for the solderable mounting functional layer. A connection of mirror and board can also be achieved by a solder bond or a eutectic bond with the previously mentioned metal combinations. Tin/silver solders, for example SAC305, can be used for a solder bond.

A direct bonding method can also be employed by utilizing very high surface finishes of Ra<1 nm. This can be a direct fusion bond, which is executed in a hydrophobic or hydrophilic manner regarding the surface characteristics of the bond partners. The two bond partners are initially connected by van der Waals bonds through a pre-bond. Through a subsequent annealing step, covalent bonds are then formed in the bond interface. The fusion bond can also be plasma activated. This allows a significant reduction of the temperature load during annealing. An anodic bonding can be provided as a further direct bonding method.

As an alternative to the methods described, a reactive bonding process may also be utilized. In a reactive bond, a metal stack of alternating layers is applied. This metal stack can be provided, for example, by deposition methods such as sputtering or in the form of foil. An electrical or laser-induced pulse leads to a short-term generation of a high-thermal reaction which "welds" the two bond partners together. The metal layers are bilayer periods, for example made of palladium and aluminum or of copper oxide and aluminum.

In addition, solid-liquid interdiffusion bonding is also possible, for example from metal combinations of gold and indium, gold and tin or copper and tin. In this method, the bonding process during an annealing step is determined by the diffusion of the one bonding partner into the other. The actual connection phase then resists higher temperatures later. Furthermore, permanent connections can be manufactured by joining, for example, gold with gold, copper with copper or aluminum with aluminum by (for example) thermal compression bonding. Glass frit bonding can also be provided.

In the case of transparent substrates, if the surface finish of the joining surfaces is corresponding, a laser welding method can be utilized for connecting the carrier substrate and the spacer. The use of epoxy resins, silicones or other adhesives is also conceivable.

For example, a direct bonding method can be utilized to connect the spacer and the cover substrate (e.g., manufacturing a cap wafer). Such methods are for example the anodic bond or a fusion bond. Reactive bonding or an adhesive bond can also be utilized. Furthermore, solid-liquid interdiffusion bonding or a eutectic solder bond can also be used herein. Laser welding is also suitable for joining the spacer and cover substrate. Hereby, two substrates are brought into an "optical contact" and then welded with a laser. It is conceivable to use all the aforementioned joining methods for spacers and carrier substrates also for the joining of spacers and cover substrates.

BRIEF DESCRIPTION

Some of the embodiments will be described in detail, with references to the following Figures, wherein like designations denote like members, wherein.

DETAILED DESCRIPTION

Figure 1:
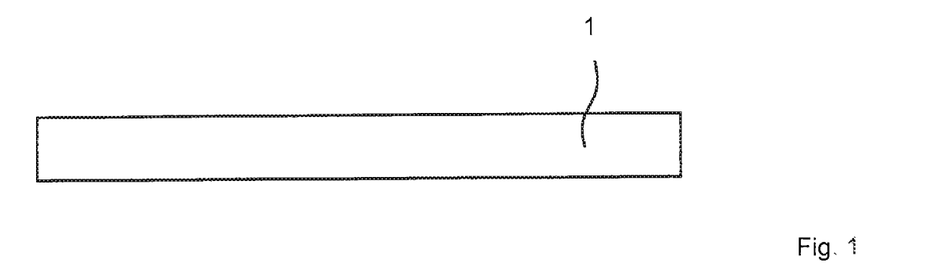
FIG. 1 is a schematic representation of a wafer in section.

FIG. 1 shows a schematic representation of a wafer 1 in section.

Figure 2:
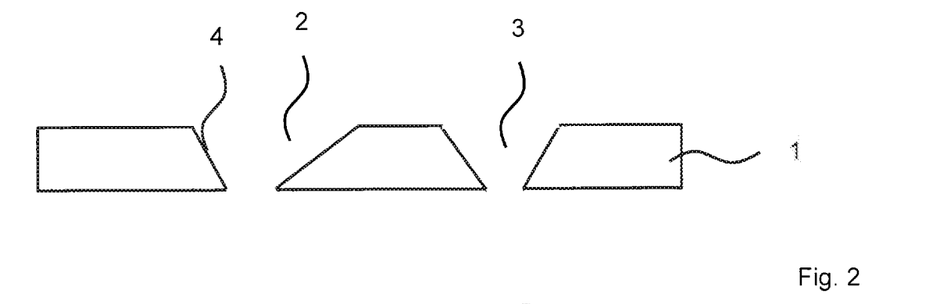
FIG. 2 is a schematic representation of the wafer from FIG. 1 in section, in which openings are now etched in an anisotropic manner at wafer level.

FIG. 2 shows a schematic representation of the wafer 1 from FIG. 1 in section, wherein the wafer 1 is anisotropically etched in such a manner that openings 2, 3 are formed, which are designed as through-openings in the embodiment shown.

Figure 3:
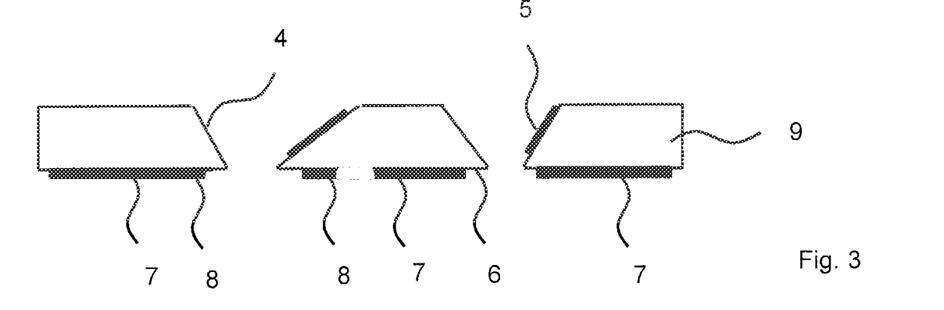
FIG. 3 is a schematic representation of the wafer from FIG. 2 in section, wherein a mounting functional layer is manufactured at wafer level in the region of anisotropically etched surfaces and optical functional surfaces are manufactured in the region of surface portions of a polished wafer surface.

The wafer 1 in FIG. 2 has anisotropically etched surfaces 4, to which a particular mounting functional layer 5 is applied in regions according to FIG. 3, which is formed with a solderable metal coating in the embodiment shown. According to FIG. 3, six optical functional surfaces 7 are also manufactured in the region of a polished wafer surface by applying a particular optical functional layer 8, for example as a multilayer system. With the optical functional view 8, for example, a dielectric mirror can be provided. By the optical functional surface 7, the optical properties of the polished wafer surface 6 are changed compared to the state without the optical functional layer 8, for example regarding light reflection, light dispersion and/or light absorption. The optical functional layer 8 can be microstructured, for example for providing Fresnel lenses in the optical functional surface 7. Such microstructuring is possible as the polished wafer surface 6 provides a sufficiently smooth substrate.

Figure 4:
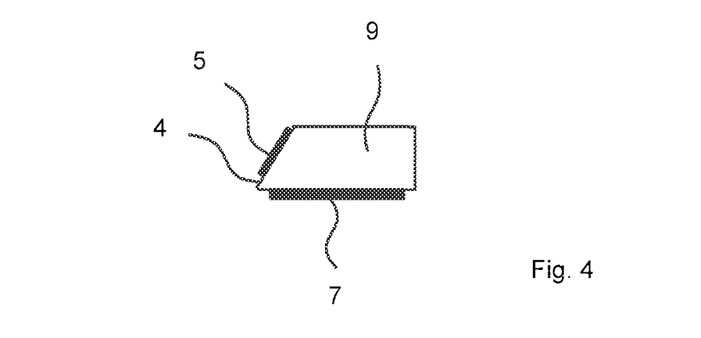
FIG. 4 is a separated element manufactured by separation from the wafer in FIG. 3.

Then, according to FIG. 4, an element or component 9 is manufactured by separating the wafer 1.

Figure 5:
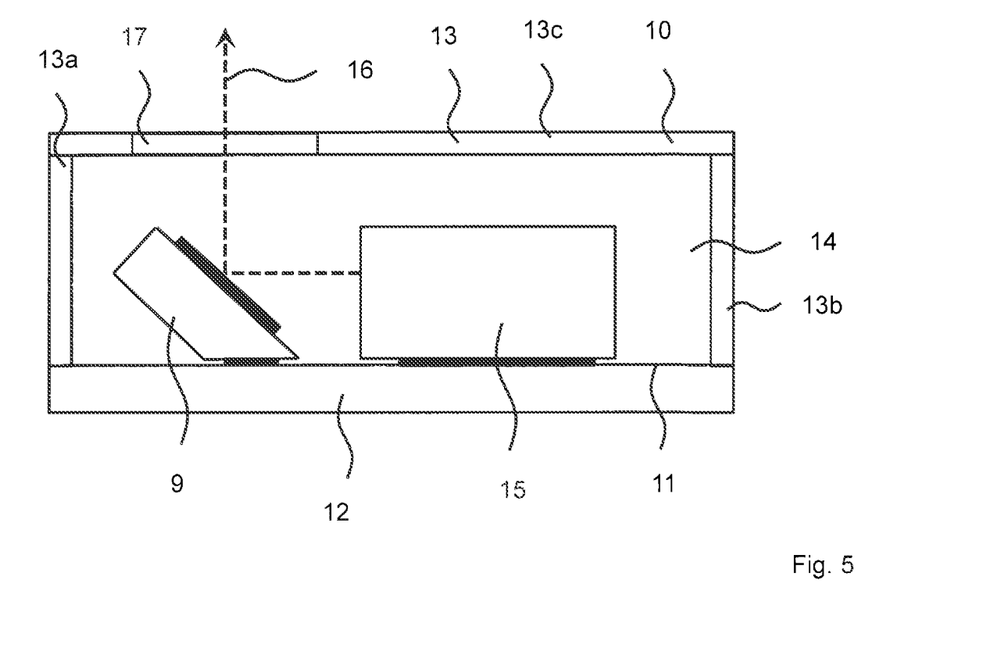
FIG. 5 is a schematic sectional representation of a package in which the separated element from FIG. 4 is mounted on a carrier substrate.

The separated element 9 can then be mounted according to FIG. 5 in a package 10 on a substrate surface 11 of a carrier substrate 12 by soldering, wherein hereby the solderable metal coating of the mounting functional layer 5 is used to mount the separated element 9 on the carrier substrate 12.

The optical functional surface 7 is arranged as an exposed surface according to FIG. 5, which has an angle of inclination, for example approximately 45 degrees, to the substrate surface 11. With a housing component 13, which can be a single or multi-piece design, an installation space 14 is provided in which the separated element 9 as well as an optical component 15, which is also mounted on the substrate surface 11, is arranged, for example by soldering or bonding. In the case of a multi-piece design, the housing component 13 is formed, for example, with spacers 13a, 13b and a cover component or cover substrate 13c.

Light beams 16 incident on the optical functional surface 7 are at least partially reflected. In this manner it is possible to decouple light beams emitted by the optical element 9 from the package 10 through an optical window 17 or to receive light beams hereby in order to transmit them to the optical element 9, which can therefore be for example a light-emitting or a light-sensitive diode. Particularly, the forming of the optical functional surface 7 having a dielectric mirror allows such light redirection or conduction.

Figure 6:
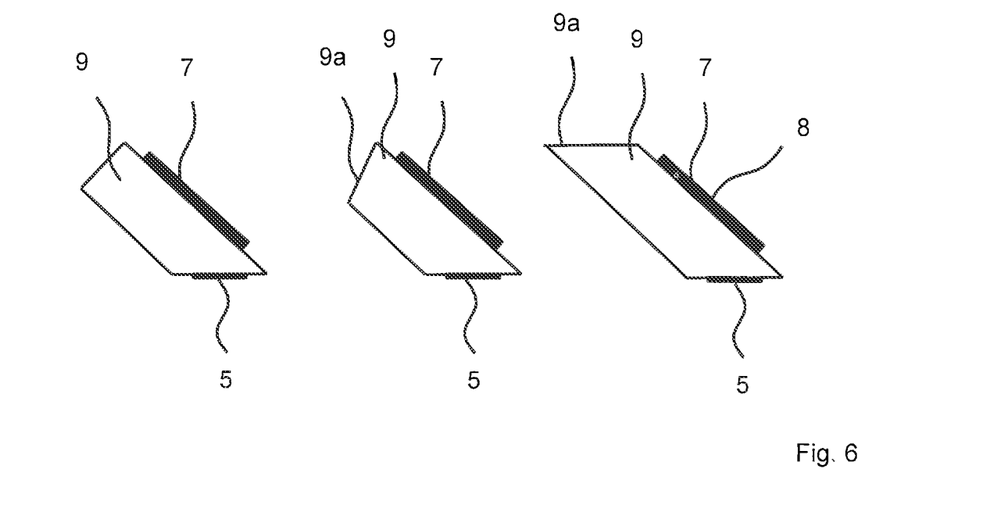
FIG. 6 is a schematic representation of different embodiments for a separated element.

FIG. 6 shows a schematic representation of the separated component or element 9 in different embodiments. In the design on the left-hand side in FIG. 6, an upper edge 9a was manufactured by mechanical processing, for example sawing. The upper edge 9a of the middle illustration in FIG. 6 is manufactured by etching. For example, an inclination angle of 64 degrees is formed. In the design on the right-hand side in FIG. 6, the upper edge 9a is etched at an angle of 45 degrees. This can be achieved, for example, by simultaneously etching anisotropically from both sides. For this purpose, an etch masking made of, for example, LPCVD nitride is structured in alignment to one another on both sides and then the substrate is etched, for example in KOH.

The upper edge 9a may be embossed parallel to the mounting surface. This makes it possible to effectively handle the component 9 in a later assembling process, as in this case the component can be processed with standardized Pick & Place machines.

It is also conceivable to combine the manufacturing method of the component 9 according to the left and the middle illustrations in FIG. 6 with the manufacturing previously described for the right illustration in FIG. 6. The resulting edge 9a then has on the right-hand side thereof a portion running parallel to the mounting surface and on the left-hand side a portion inclined thereto, as shown in the left-hand and middle illustration of FIG. 6. This has the advantage that the focus of the component 9 is positively influenced in such a manner that the component 9 can be exactly positioned and held during the later mounting thereof on a board.

Alternatively to the embodiments shown in FIG. 6, the optical functional layer 8 and/or the mounting functional layer 5 can be omitted. The optical functional surface 7 is then free from the optical functional layer 8. The optical properties, for example the reflectivity, can correspond to the reflectivity of the polished wafer surface 6. An adhesive applied at this time can serve as an alternative mounting functional layer 5 during mounting.

Figure 7:
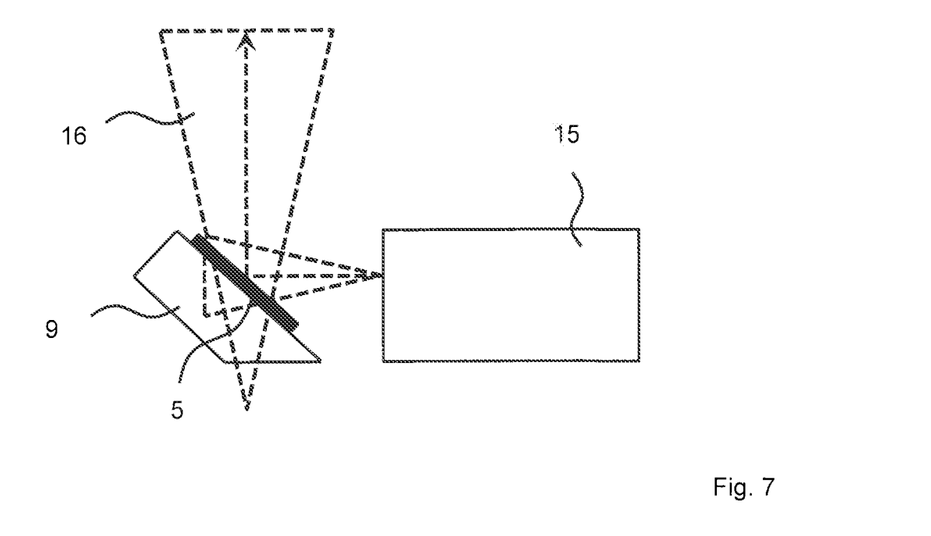
FIG. 7 is a schematic representation of an arrangement having an optical component, the emitted light of which is reflected on a flat surface.
Figure 8:
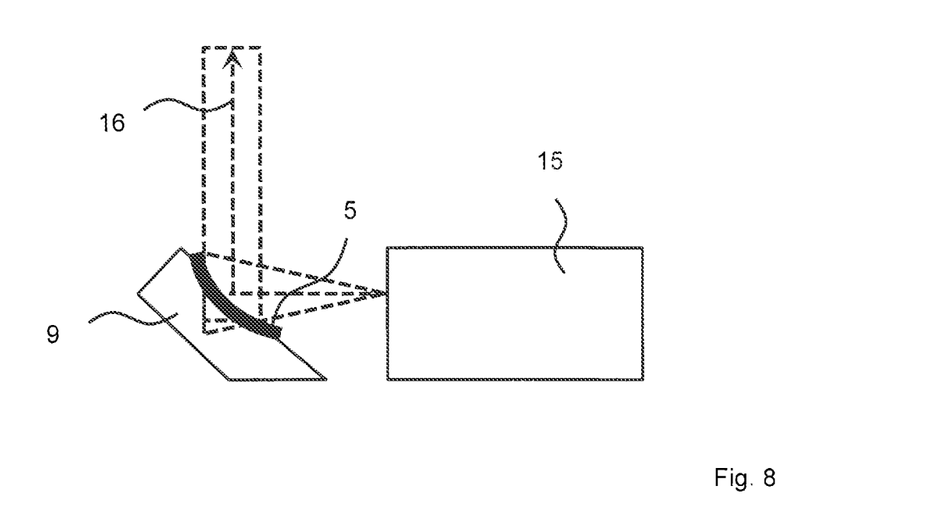
FIG. 8 is a schematic representation of an arrangement having an optical component, the emitted light of which is converted into a parallel beam.

FIGS. 7 and 8 show different designs for an arrangement having the optical component 15 emitting light and the separated element 9. The light emitted by the optical component 15 is reflected on a flat optical functional surface according to FIG. 7, in such a manner that a light beam is emitted having an opening angle. In the design in FIG. 8, the optical functional surface 7 is formed with a trough (lens) in such a manner that a parallel beam is emitted by beam forming.

Figure 9:
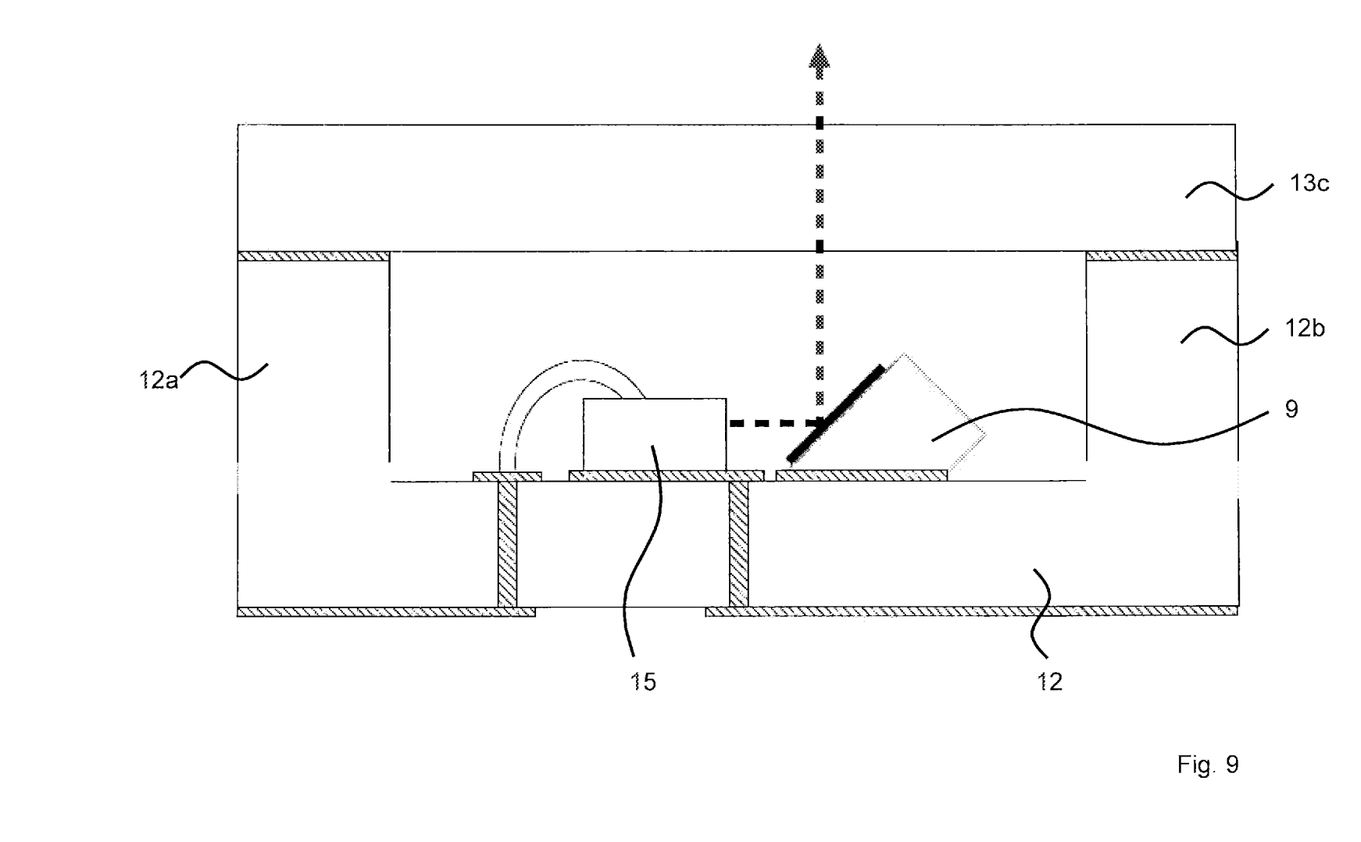
FIG. 9 is a schematic sectional representation of a package in which a separated element and an optical component are arranged in a recess of a submount.
Figure 10:
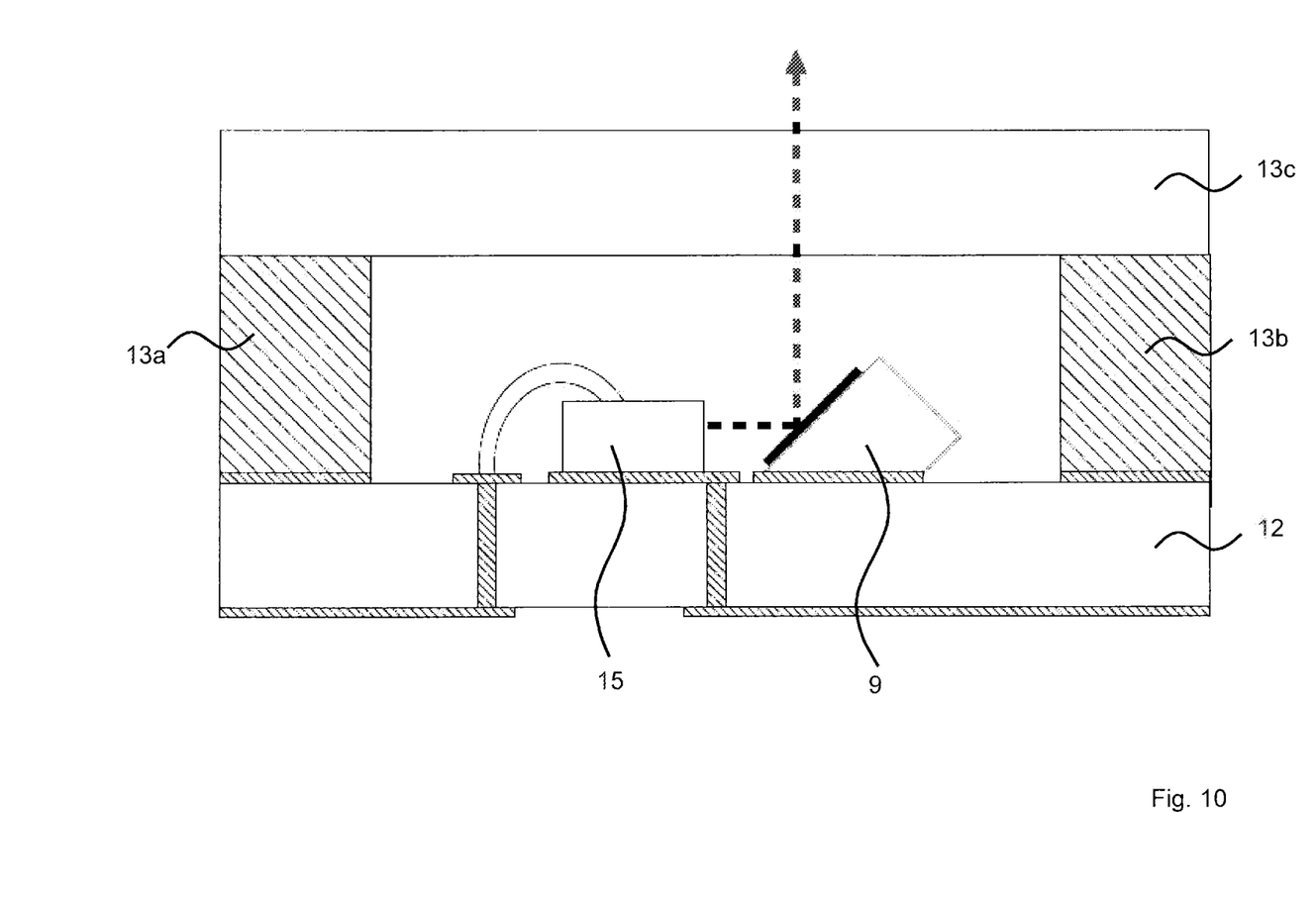
FIG. 10 is a schematic sectional representation of a package in which a separated element and an optical component are arranged on a submount.

FIGS. 9 and 10 show schematic sectional representations of a package in which the separated element 9 and the optical element 15 are arranged on a carrier substrate 12 designed as a submount. The optical element 16 is connected by through-connections 30. In the design in FIG. 9, the carrier substrate 12 has a recess 20. In the embodiment in FIG. 10, the cover substrate 13c is spaced from the carrier substrate 12 by the spacers 13a, 13b, which are mounted on the carrier substrate 12. Such spacers are formed in the design in FIG. 9 by lateral portions 12a, 12b of the carrier substrate (submount) 12 itself, which laterally limit the recess 20.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. A method for manufacturing a component arrangement for a package, comprising:
   providing a wafer of a semiconductor material having a polished wafer surface;
   forming an opening in the wafer by anisotropic etching, wherein an anisotropically etched surface is manufactured in a region of the opening;
   separating a component from the anisotropically etched wafer, wherein the separated component is manufactured having the following surfaces:
      an optical surface formed in a region of a surface portion of the polished wafer surface, and
      a mounting surface formed in the region of the anisotropically etched surface; and
   mounting the separated component on a substrate surface of a support substrate using the mounting surface, in such a manner that the anisotropically etched surface is bonded to the substrate surface, wherein hereby the optical surface is arranged as an inclined exposed surface;
   wherein the mounting surface is formed having a mounting functional layer manufactured in a region of the mounting surface, and the mounting functional layer is manufactured having a solderable metal coating.

2. The method according to claim 1, wherein the optical surface is manufactured having an optical functional surface, wherein hereby an optical functional layer is applied in the surface portion of the polished wafer surface in such a manner that the optical properties of the polished wafer surface are changed in the surface portion.

3. The method according to claim 2, wherein the optical functional surface is applied at wafer level prior to separation.

4. The method according to claim 2, wherein the optical functional surface is manufactured having a microstructured layer.

5. The method according to claim 2, wherein the optical functional layer is applied as a multilayer system.

6. The method according to claim 1, wherein the anisotropically etched surface is manufactured having an inclination angle of approximately 45 degrees in relation to the polished wafer surface.

7. The method according to claim 1, wherein a wafer made of silicon is provided and is etched in an anisotropic manner.

8. The method according to claim 1, wherein the mounting functional layer is applied at wafer level prior to separation.

9. The method for manufacturing a package having a component arrangement manufactured by a method according to claim 1, wherein a housing is manufactured by a housing component, in which at least the separated component is accommodated.

10. A method for manufacturing a component arrangement for a package, comprising:
- providing a wafer of a semiconductor material having a polished wafer surface;
- forming an opening in the wafer by anisotropic etching, wherein an anisotropically etched surface is manufactured in a region of the opening;
- separating a component from the anisotropically etched wafer, wherein the separated component is manufactured having the following surfaces:
  - an optical surface formed in a region of a surface portion of the polished wafer surface, and
  - a mounting surface formed in the region of the anisotropically etched surface; and mounting the separated component on a substrate surface of a support substrate using the mounting surface, in such a manner that the anisotropically etched surface is bonded to the substrate surface, wherein hereby the optical surface is arranged as an inclined exposed surface;
- wherein the mounting surface is formed having a mounting functional layer manufactured in a region of the mounting surface, and the mounting functional layer is applied at wafer level prior to separation.

* * * * *